United States Patent [19]

Omura

[11] Patent Number: 5,495,438
[45] Date of Patent: Feb. 27, 1996

[54] NONDESTRUCTIVE READOUT-TYPE FERROELECTRIC MEMORY DEVICE HAVING TWISTED HYSTERESIS

[75] Inventor: Masayoshi Omura, Saitama, Japan

[73] Assignees: Olympus Optical Co., Ltd., Tokyo, Japan; Symetrix Corporation, Colorado Springs, Colo.

[21] Appl. No.: 328,110

[22] Filed: Oct. 24, 1994

[30] Foreign Application Priority Data

Oct. 27, 1993 [JP] Japan .................. 5-269166

[51] Int. Cl.$^6$ .................................. G11C 11/22
[52] U.S. Cl. .................. 365/145; 365/149; 257/295
[58] Field of Search ................. 365/145, 149, 365/117, 109; 257/295

[56] References Cited

U.S. PATENT DOCUMENTS

| | | | |
|---|---|---|---|
| 5,060,191 | 10/1991 | Nagasaki et al. | 365/145 |
| 5,155,573 | 10/1992 | Abe et al. | 365/145 |
| 5,262,983 | 11/1993 | Brennan | 365/145 |
| 5,291,436 | 3/1994 | Kamisawa | 365/145 |

FOREIGN PATENT DOCUMENTS 2-154389  6/1990  Japan .

Primary Examiner—David C. Nelms
Assistant Examiner—Huan Hoang
Attorney, Agent, or Firm—Frishauf, Holtz, Goodman, Langer & Chick

[57] ABSTRACT

A first ferroelectric capacitor has a ferroelectric member having a film thickness and an area, and electrodes formed on both major surfaces of the member, respectively. Thus, the first ferroelectric capacitor has a polarization. A second ferroelectric capacitor has a ferroelectric member having a film thickness and an area, and electrodes formed on both major surfaces of the member, respectively. Thus, the second ferroelectric capacitor has a polarization. The first and second ferroelectric capacitors are connected parallel to each other, thereby forming a ferroelectric memory device. Since the ferroelectric memory device uses the synthesized hysteresis characteristics of the two ferroelectric capacitors of different coercive field values, it can use multi-value data, and perform nondestructive readout of data stored in the capacitors.

10 Claims, 4 Drawing Sheets

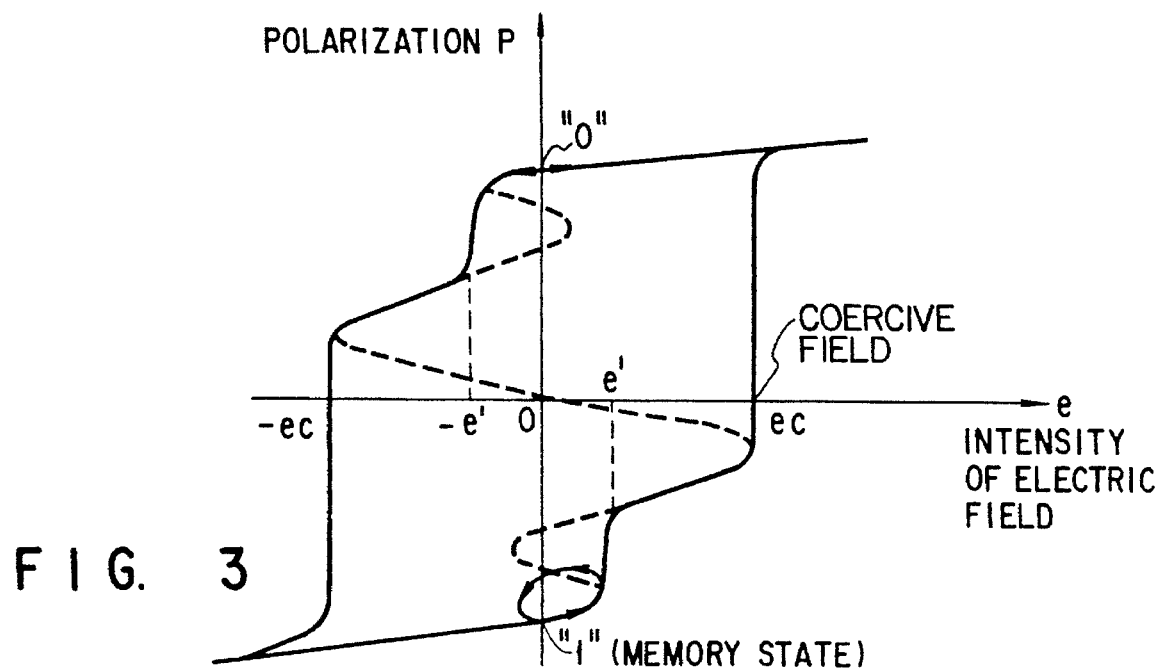
F I G. 3
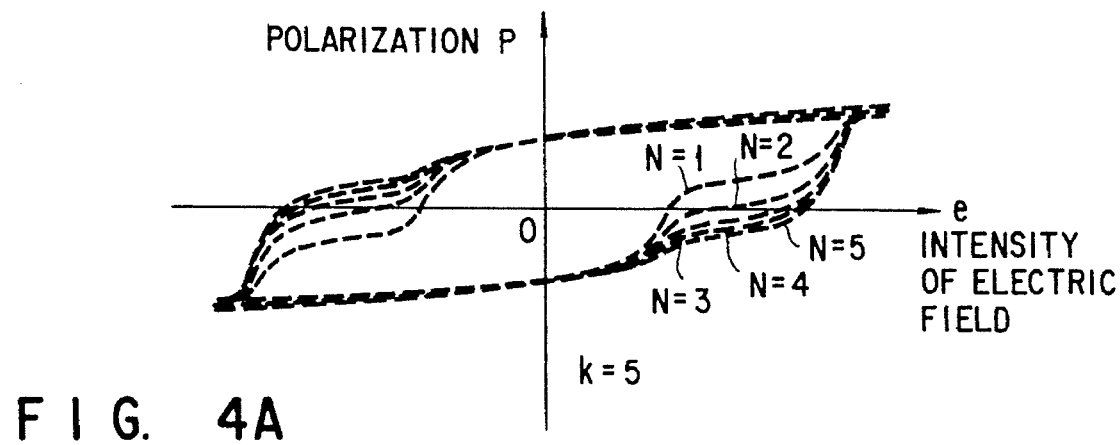
F I G. 4A
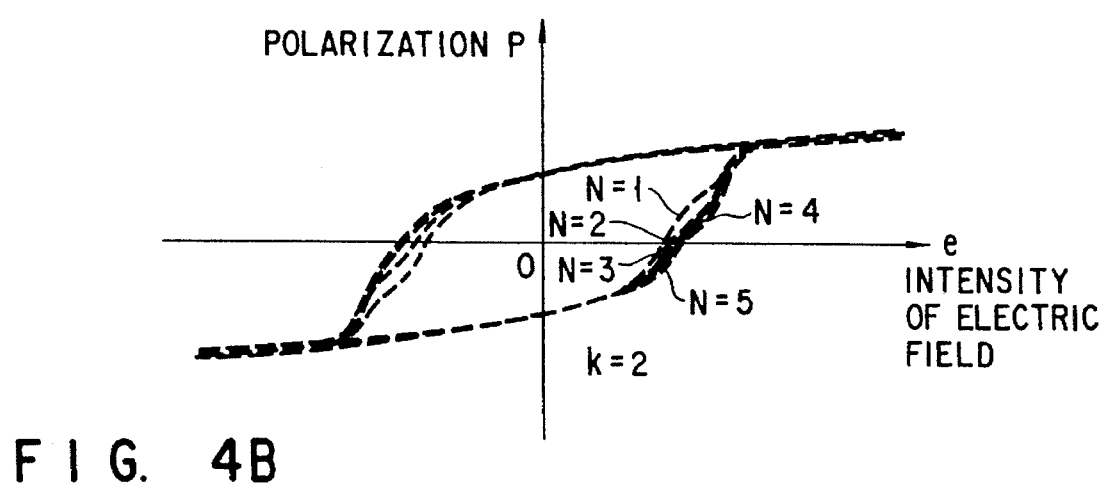
F I G. 4B

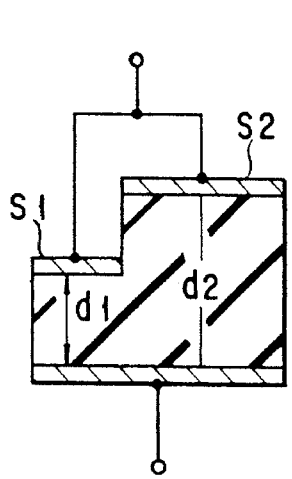
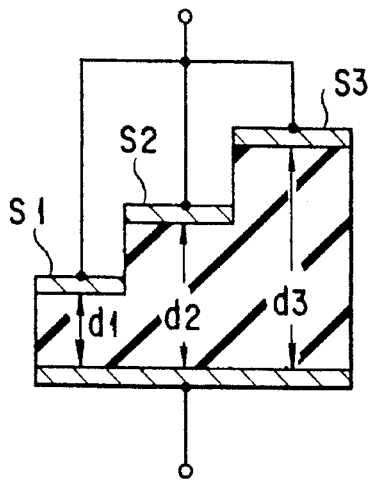
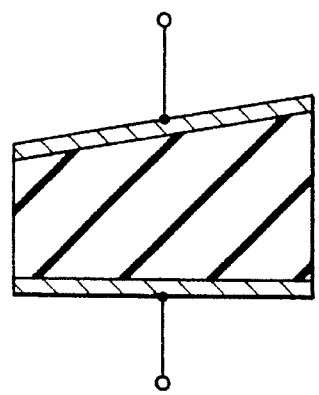
F I G. 5A    F I G. 5B    F I G. 5C
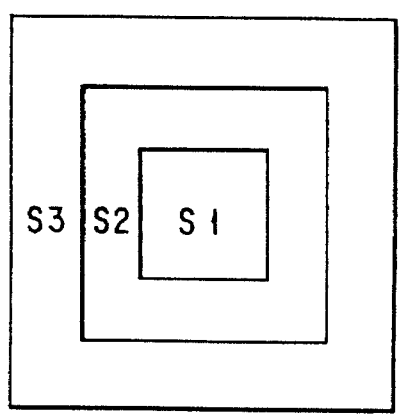
F I G. 6A2
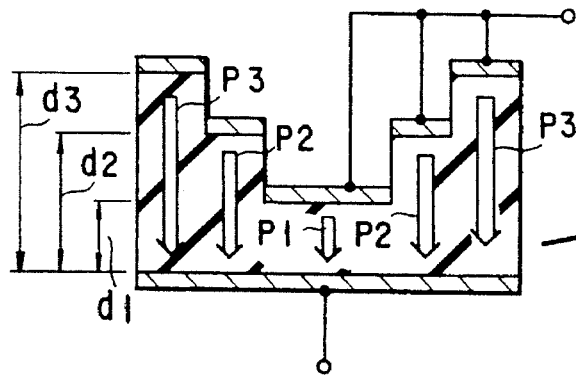
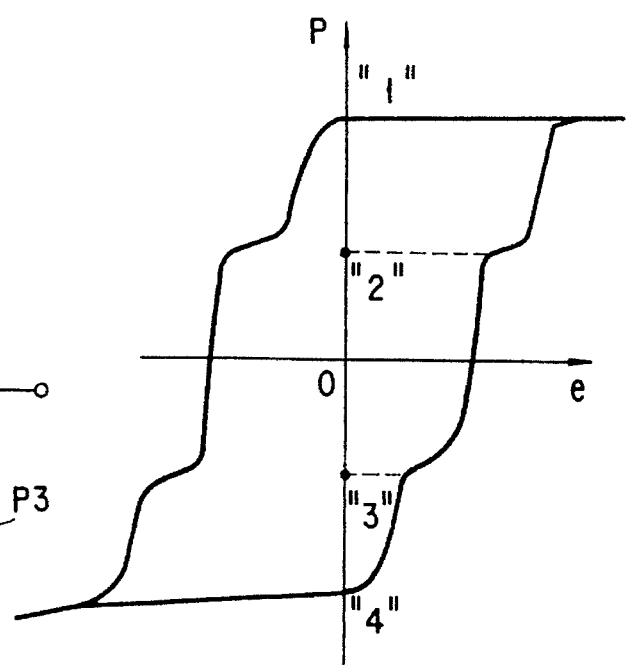
F I G. 6A1    F I G. 6B

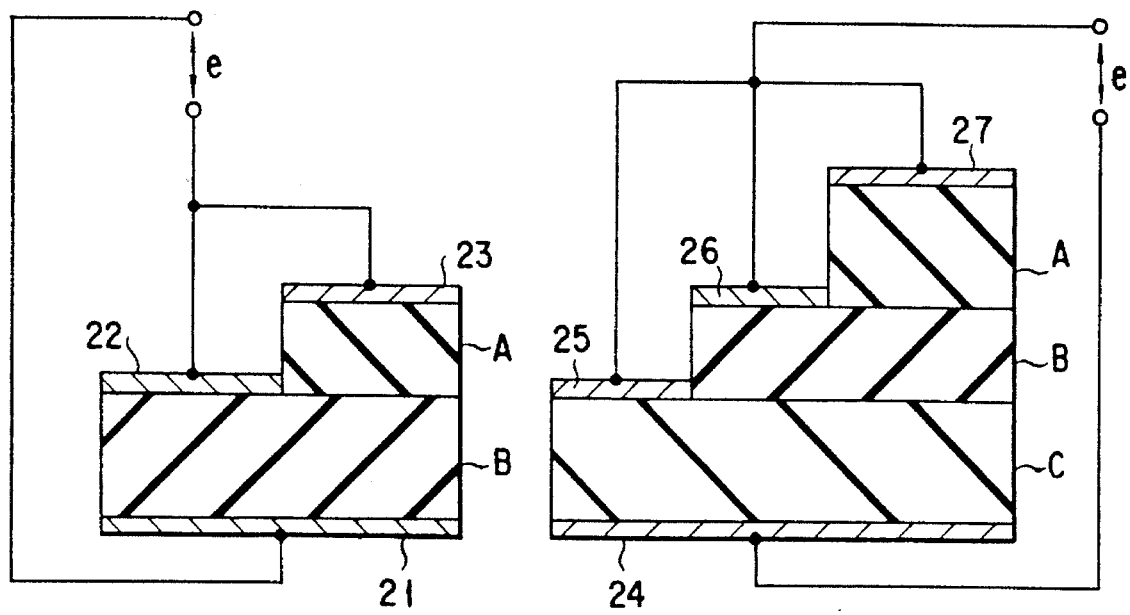
F I G. 7A  F I G. 7B
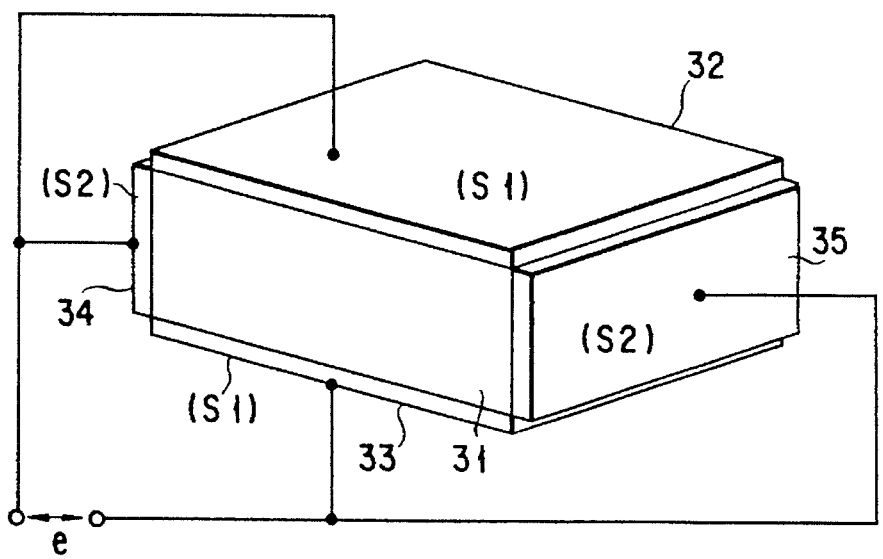
F I G. 8

NONDESTRUCTIVE READOUT-TYPE FERROELECTRIC MEMORY DEVICE HAVING TWISTED HYSTERESIS

BACKGROUND OF THE INVENTION

1. Field of the Invention

This invention generally relates to a ferroelectric memory device and, more particularly, to a nondestructive readout-type ferroelectric memory device using a memory medium of a ferroelectric material.

2. Description of the Related Art

In general, a ferroelectric material has hysteresis characteristics. To utilize such hysteresis characteristics in a nonvolatile ferroelectric memory device for storing data is widely known. The element structure of the ferroelectric memory device is divided broadly into the following two types:

One type is called a "simple matrix structure", wherein each intersection of strip electrodes which are formed on the upper and lower surfaces of a ferroelectric thin film such that they cross at right angles to one another is used as a memory cell. Since the simple matrix structure is a complicated structure, there is a limitation in producing a highly integrated ferroelectric memory device where the simple matrix structure is employed. Destructive readout, which uses a polarization-inverted current required to rewrite data into a selected cell, is performed to read data from each memory cell of the ferroelectric memory device of the simple matrix structure.

On the other hand, the other type structure is disclosed in U.S. Pat. No. 5,060,191 assigned to the same assignee as that of the present application. In this case, writing and reading operations are performed at low impedance by the use of the self-inversion phenomenon of a ferroelectric thin film, without adversely affecting non-selected cells. Here, the self-inversion phenomenon means a phenomenon in which the state of polarization of the ferroelectric thin film returns to its initial state when a pulse has been applied to the thin film from the outside.

However, the above-described conventional ferroelectric memory devices have the following problems:

In the case of the ferroelectric memory device which performs destructive readout, the ferroelectricity is deteriorated and accordingly the remanence is lowered, since polarization inversion is repeated. As a result, the memory device can hardly have a long life, and a complicated circuit is necessary to perform rewriting.

Further, in the case of the ferroelectric memory device disclosed in Jpn. Pat. Appln. KOKAI Publication No. 2-154389, the publication does not disclose any specific mechanism or structure for realizing the self-inversion phenomenon of spontaneous polarization, although it is highly possible to use the ferroelectric memory device for realizing writing and reading in a simple matrix structure.

SUMMARY OF THE INVENTION

It is, therefore, an object of the present invention to provide a new and improved ferroelectric memory device which can perform nondestructive readout, can have a long life, and is suitable to high integration.

According to one aspect of the invention, there is provided a ferroelectric memory device comprising:

a plurality of memory cells arranged in a matrix, each memory cell including:

a first ferroelectric capacitor which has a first ferroelectric member made of a first ferroelectric material and having a first film thickness and a first area, and first and second electrodes formed on first and second major surfaces of the first ferroelectric member, the first ferroelectric capacitor having a first coercive field; and a second ferroelectric capacitor which has a second ferroelectric member made of a second ferroelectric material and having a second film thickness and a second area, and third and fourth electrodes formed on first and second major surfaces of the second ferroelectric member, the second ferroelectric capacitor having a second coercive field;

the first and second capacitors being connected parallel to each other via the first through fourth electrodes.

Since in a single memory cell of the above ferroelectric memory device, the ferroelectric capacitors which store data have different coercive field values, the synthesized hysteresis characteristics of the capacitors are those of twisted hysteresis, which enable the use of multi-value data and nondestructive readout of the stored data.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a graph, showing the twisted hysteresis characteristics of a ferroelectric capacitor employed in the ferroelectric memory device of the first embodiment;

FIGS. 4A and 4B are graphs, showing simulated examples of synthesized hysteresis characteristics of the ferroelectric capacitor employed in the ferroelectric memory device according to the first embodiment, respectively;

FIGS. 5A, 5B and 5C show different structures of a ferroelectric memory device according to a second embodiment of the invention, respectively;

FIGS. 6A1 and 6A2 show a ferroelectric memory device according to a third embodiment of the invention;

FIG. 6B shows the hysteresis characteristics of the device of FIGS. 6A1 and 6A2;

FIGS. 7A and 7B show different structures of a ferroelectric memory device according to a fourth embodiment of the invention, respectively; and FIG. 8 shows a ferroelectric memory device according to a fifth embodiment of the invention.

DETAILED DESCRIPTION OF THE PREFERRED EMBODIMENTS

Figure 1A:
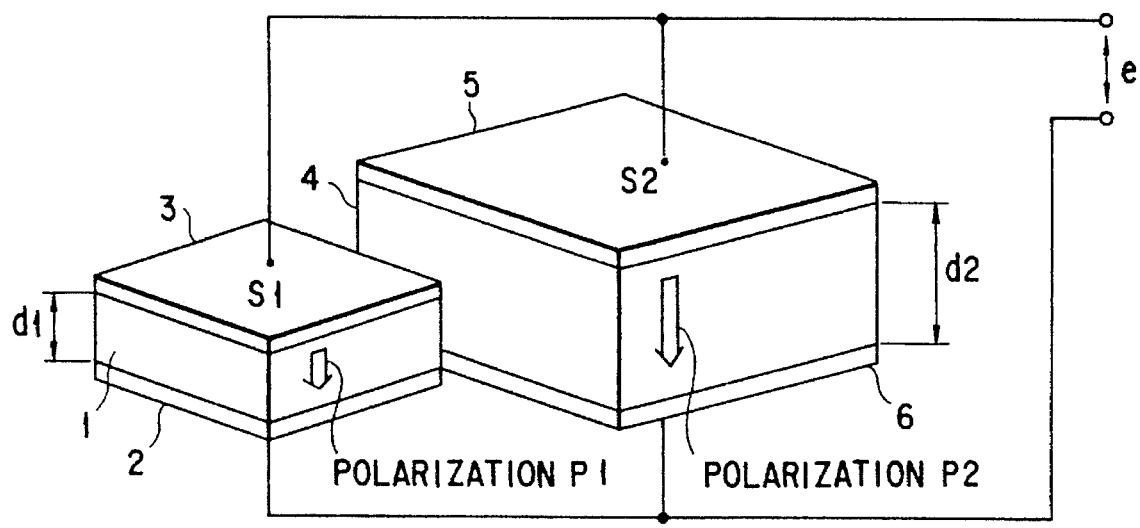
FIG. 1A is a view, showing a ferroelectric memory device according to a first embodiment of the invention.

Reference will now be made in detail to the presently preferred embodiments of the invention as illustrated in the accompanying drawings, in which like reference characters designate like or corresponding parts throughout the several drawings.

First, the general concept of a ferroelectric memory device of the invention will be explained.

The ferroelectric memory device has a plurality of ferroelectric capacitors connected parallel to one another. These capacitors are formed of ferroelectric members, which each have at least a portion made of the same material as a portion of another, and have different coercive fields. The capacitors are formed on a common lower electrode such that they have different thickness and different major surface areas.

The device may be modified such that the lamination structure of the ferroelectric capacitors, which are made of several ferroelectric materials and have different coercive fields, is changed to change the coercive fields. Further, the major surfaces of the ferroelectric capacitors may be changed.

Even when in the ferroelectric memory device constructed as above, data ("1" or "0") stored in a memory cell has been read out by applying a readout driving voltage thereto, the data is not lost since the readout is a nondestructive one. Accordingly, a rewriting circuit is not necessary.

The operation and characteristics of the above ferroelectric memory device will be explained. Here, a method for analyzing a hysteresis obtained from a structure having two portions will be described.

First, suppose that the polarization of a ferroelectric portion of an area S1 and a thickness d1 is represented by P1, and the polarization of a ferroelectric portion of an area S2 and a thickness d2 is represented by P2. In this case, the polarizations P1 and P2 obtained with lapse of time in accordance with the viscosity of the ferroelectric material are expressed by $$\gamma \cdot \frac{dP_1}{dt} = -(\alpha P_1 + \beta P_1^3 - e) \quad (1)$$

$$\gamma \cdot \frac{dP_2}{dt} = -\left(\alpha P_2 + \beta P_2^3 - \frac{e}{k}\right) \quad (2)$$

where k represents the ratio between the thicknesses (k=d2/d1), N the ratio between the areas (N=S2/S1), e the intensity of an electric field, $\alpha$ a function of temperature, $\alpha$=a(T−T0) (a>0; T is the absolute temperature and, T0 is Curie's temperature), and y the coefficient of the viscosity of the ferroelectric material. A synthesized polarization P is given by $$P=(P_1+N \times P_2)/(1+N) \quad (3)$$

Referring then to FIG. 1A, a ferroelectric memory device according to the first embodiment of the invention will be roughly explained.

As is shown in FIG. 1A, the ferroelectric memory device includes a first ferroelectric capacitor comprising of electrodes 2 and 3 and a ferroelectric member 1 which has a film thickness d1 and an area S1 and also has both major surfaces thereof held between the electrodes 2 and 3; and a second ferroelectric capacitor comprising electrodes 5 and 6 and a ferroelectric member 4 which has a film thickness d2 and an area S2 and also has both major surfaces thereof held between the electrodes 5 and 6. The first and second ferroelectric capacitors are connected parallel to each other, and have polarizations P1 and P2, respectively. The thickness ratio k=d2/d1 and the area ratio N=S2/S1 are used as parameters.

Figure 1B:
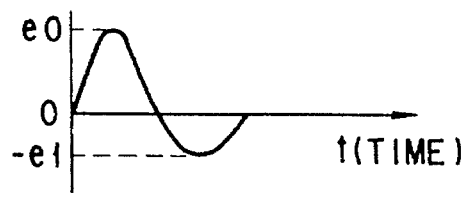
FIG. 1B is a graph, showing a driving signal read from the device of FIG. 1A.

Further, as is shown in FIG. 1B, a readout driving signal e for driving the ferroelectric memory device has a wave with a positive amplitude $e_0$ smaller than a first coercive field $e_c$ (see FIG. 3) and a negative amplitude $e_1$ smaller than the positive amplitude $e_0$ and a second coercive field e' (see FIG. 3) ($e_1=e_0/2 < e_0 < e_c$). The driving signal may have a sine wave, a rectangular wave, a triangular wave or a wave obtained by combining them.

The hysteresis characteristics of the ferroelectric capacitors employed in the ferroelectric memory device of the invention are those of synthesized hysteresis (called "twisted hysteresis") as shown in FIG. 3. The film thickness ratio k=d2/d1 and the area ratio N=S2/S1 are used as parameters. The reason why the above hysteresis characteristics are useful in performing nondestructive readout is explained in detail in U.S. Ser. No. 07/838,557 (abandoned in favor of Continuation application U.S. Ser. No. 08/315,193) and assigned to the same as Assignee as that of the present application. Therefore, no explanation will be given thereof here.

FIGS. 4A and 4B show the results of simulation of hysteresis which are obtained as a result of varying the film thickness ratio and the area ratio in the ferroelectric memory device. Specifically, FIG. 4A shows the results obtained where the film thickness ratio k is 5 and the area ratio N is 1–5; while FIG. 4B shows the results obtained where the film thickness ratio k is 2 and the area ratio N is 1–5.

As is evident from FIG. 4A, when the film thickness k is 5, the hysteresis provides a twisted line for any value (1–5) of the area ratio N, although providing a more smooth line as the area ratio N increases.

On the other hand, as is evident from FIG. 4B, when the film thickness k is 2, the hysteresis provides no twisted line for any value (1–5) of the area ratio N.

The above simulation results indicate that the twisted hysteresis is obtained when the film thickness ratio is more than 2 (i.e., the coercive field ratio is more than 2 in the case where the films are made of the same material).

Figure 2:
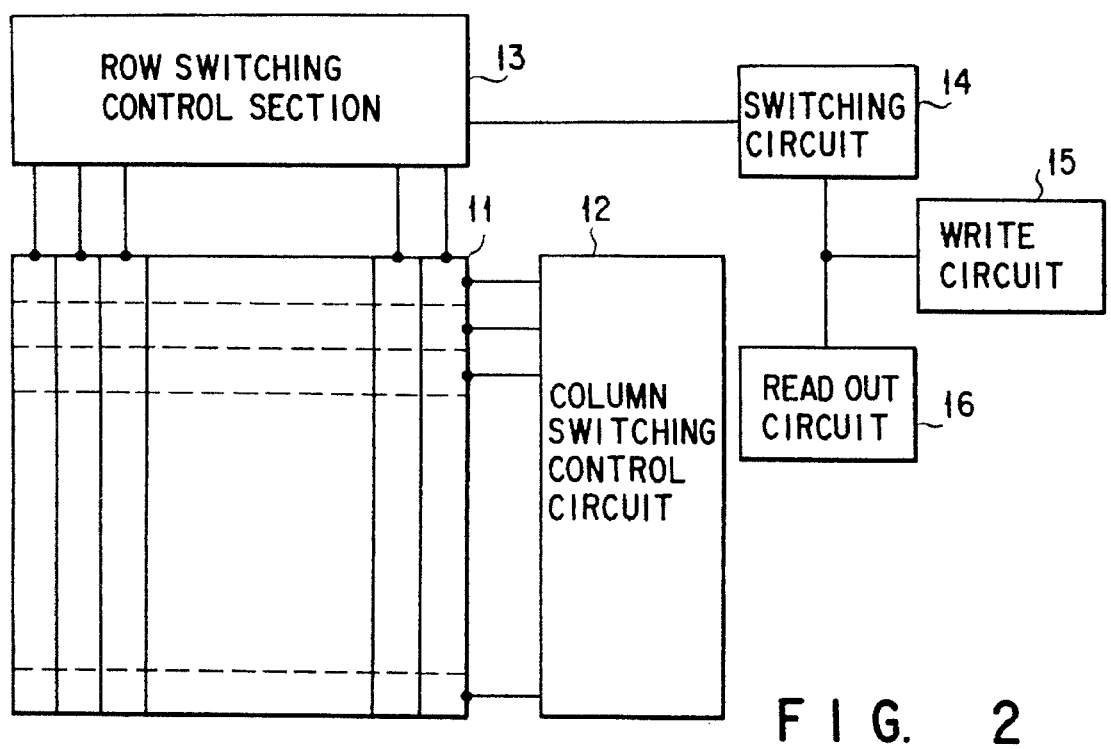
FIG. 2 is a block diagram, showing peripheral circuits connected to the ferroelectric memory device of the invention for driving the same.

FIG. 2 shows an example of a structure in which peripheral circuits are provided for driving the ferroelectric memory device. A column switching section 12 and a row switching section 13 are connected to each memory cell of a memory cell matrix 11 in which memory cells are arranged in rows and columns. The row switching section 13 is connected to a writing circuit 14 and a readout circuit 16 via a switching circuit 14 for switching the operation of the device between a writing operation and a readout operation.

The operation of the ferroelectric memory device constructed as above will now be explained. Here, a matrix memory having hysteresis characteristics as shown in FIG. 3 will be explained.

First, a voltage higher than the coercive field $e_c$ is applied to each memory cell of the matrix memory 11 via the writing circuit 15, the column switching section 12 and the row switching section 13. As a result, writing in the direction of polarization is performed in each memory cell.

After the writing, the switching circuit 14 switches the operation from the writing circuit 15 to the reading circuit 16. Then, a voltage lower than the coercive field $e_c$ is applied to a selected memory cell via the column and row switching sections 12 and 13, thereby reading data therefrom. The conditions of the readout driving signal are as described above.

In the synthesized hysteresis characteristics employed in the invention, differentiated dielectric constants (inclinations of hysteresis) for readout voltages corresponding to "1" and "0" significantly differ from each other.

Therefore, in the present invention, a complicated circuit is not necessary which is employed in the conventional device for rewriting data lost as a result of destructive readout, and a deterioration in the performance of the device due to fatigue after long use can be minimized. Thus, the invention can provide a ferroelectric memory device of a long life and high performance.

FIGS. 5A, 5B and 5C show examples of ferroelectric memory devices according to a second embodiment, which employ ferroelectric capacitors of different film thicknesses and areas, respectively.

In each ferroelectric memory device, ferroelectric member portions of different thicknesses are laminated on a common lower electrode. FIG. 5A shows a ferroelectric capacitor having two portions of film thicknesses d1 and d2 and areas S1 and S2; FIG. 5B shows a ferroelectric capacitor having three portions of film thicknesses d1, d2 and d3 and areas S1, S2 and S3; and FIG. 5C shows a ferroelectric capacitor having a wedge-shaped cross section and an inclined surface on which an electrode is formed.

FIGS. 6A1 and 6A2 show a ferroelectric memory device as a multi-value memory according to a third embodiment of the invention, which comprises a ferroelectric capacitor having portions of different thicknesses and areas.

FIGS. 6A1 and 6A2 a cross sectional view and a plan view, and FIG. 6B shows the synthesized hysteresis characteristics of the device of FIGS. 6A1 and 6A2.

As is shown in FIGS. 6A1, 6A2 and 6B, the ferroelectric capacitor has three portions of different film thicknesses, areas and polarizations. As is shown in FIG. 6B, the polarizations P1, P2 and P3 can be made to correspond to four-value memory data (memory states: "1", "2", "3" and "4").

FIGS. 7A and 7B show ferroelectric memory devices according to a fourth embodiment, each of which has a ferroelectric capacitor with a laminated structure consisting of different materials (indicated by A, B and C) of different coercive field values.

In the FIG. 7A case, a ferroelectric material B is coated on a lower electrode 21, and a ferroelectric material A is coated on part of the material B. Thereafter, upper electrodes 22 and 23 are formed on the ferroelectric materials A and B, respectively. This structure provides a ferroelectric memory device of the above-described twisted hysteresis characteristics.

FIG. 7B shows an example in which three ferroelectric materials A, B and C of different coercive field values are laminated on each other as in the FIG. 7A case.

A ferroelectric memory device according to a fifth embodiment of the invention will be explained with reference to FIG. 8. A left-side electrode 34 and a right-side electrode 35 are formed on both opposite side surfaces of a ferroelectric member 31 such that they are perpendicular to upper and lower electrodes 32 and 33.

The above ferroelectric memory device utilizes a ferroelectric member having a polarization axis which is inclined with respect to the direction of polarization from the upper electrode 32 to the lower electrode 33, so as to obtain hysteresis characteristics of different coercive field values. Specifically, the hysteresis characteristics obtained when an electric field is applied in the direction from the upper electrode 32 to the lower electrode 33 and those obtained when an electric field is applied in the direction from the left-side electrode 34 to the right-side electrode 35 can be obtained as those of different field resistance values by changing the thickness and area in the vertical direction and the horizontal direction of the ferroelectric member 31.

Thereafter, the upper electrode 32 is connected to the left-side electrode 34 such that they have the same potential, and the lower electrode 33 is connected to the right-side electrode 35 such that they have the same potential. Application of an electric field to the resultant structure provides twisted hysteresis characteristics.

The invention is not limited to the above-described embodiments, but can be modified in various manners without departing from the scope thereof.

As explained in detail, the invention can provide a ferroelectric memory device which can nondestructively read data, has a long life and is suitable to high integration.

Additional embodiments of the present invention will be apparent to those skilled in the art from consideration of the specification and practice of the present invention disclosed herein. It is intended that the specification and examples be considered as exemplary only, with the true scope of the present invention being indicated by the following claims.

What is claimed is:

1. A ferroelectric memory device comprising:
   a plurality of memory cells arranged in a matrix, each memory cell including:
   a first ferroelectric capacitor which comprises a first ferroelectric member having a first film thickness and a first area, and a pair of electrodes comprising first and second electrodes formed on surfaces which each face the first ferroelectric member so as to hold the first ferroelectric member therebetween, the first ferroelectric capacitor having a first coercive field; and
   a second ferroelectric capacitor which comprises a second ferroelectric member having a second film thickness and a second area, wherein either said second film thickness differs from said first film thickness or said second area differs from said first area, a pair of electrodes comprising third and fourth electrodes formed on surfaces which each face the second ferroelectric member so as to hold the second ferroelectric member therebetween, the second ferroelectric capacitor having a second coercive field which is different from the first coercive field; and
   the first and second ferroelectric capacitors being connected parallel to each other via the first, second, third and fourth electrodes.

2. The ferroelectric memory device according to claim 1, wherein a ratio of the second film thickness to the first film thickness is set to a value higher than 2.

3. The ferroelectric memory device according to claim 1, wherein at least part of the first and second ferroelectric members is made of a same material.

4. The ferroelectric memory device according to claim 1, wherein the first and second ferroelectric members are made of a same material.

5. The ferroelectric memory device according to claim 4, wherein a ratio of the second coercive field to the first coercive field is set to a value higher than 2.

6. The ferroelectric memory device according to claim 1, wherein the second and fourth electrodes of the first and second ferroelectric capacitors are used as a common lower electrode.

7. The ferroelectric memory device according to claim 6, wherein the second ferroelectric capacitor is laminated on the first ferroelectric capacitor.

8. The ferroelectric memory device according to claim 6, wherein the first and second ferroelectric members, are made of a same ferroelectric material and are arranged adjacent to each other on the common lower electrode, the first and second ferroelectric capacitors differing from each other in at least one of said film thickness and said area.

9. The ferroelectric memory device according to claim 8, wherein the film thicknesses of the first and second ferroelectric members continuously vary in a linearly inclined manner.

10. A ferroelectric memory device comprising:

first and second electrodes arranged parallel to each other, with a predetermined spacing therebetween;

a ferroelectric member having a predetermined film thickness and area, the ferroelectric member having first and second major surfaces and the ferroelectric member being disposed such that the first and second major surfaces thereof contact the first and second electrodes, respectively, the ferroelectric member having an axis of polarization which is inclined relative to a direction perpendicular to the first and second major surfaces; and third and fourth electrodes formed on surfaces of the ferroelectric member which are opposite to each other and which are different from those surfaces of the ferroelectric member which contact the first and second electrodes; and wherein the first electrode is connected to one of the third and fourth electrodes so as to have the same potential as said one of the third and fourth electrodes, and the second electrode is connected to the other of the third and fourth electrodes so as to have the same potential as said other of the third and fourth electrodes.

* * * * *